US008010854B2

(12) United States Patent
McGinty et al.

(10) Patent No.: US 8,010,854 B2
(45) Date of Patent: Aug. 30, 2011

(54) METHOD AND CIRCUIT FOR BROWNOUT DETECTION IN A MEMORY SYSTEM

(75) Inventors: Stephen F. McGinty, Austin, TX (US); Jochen Lattermann, Munich (DE); Ross S. Scouller, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 175 days.

(21) Appl. No.: 12/473,934

(22) Filed: May 28, 2009

(65) Prior Publication Data

US 2010/0306604 A1 Dec. 2, 2010

(51) Int. Cl.
*G11C 29/00* (2006.01)

(52) U.S. Cl. .............. 714/721; 714/5; 714/8; 714/25; 714/29; 714/36; 714/42; 714/48; 714/54; 714/718; 714/719; 714/723; 714/736; 714/742; 714/745; 714/818; 711/100; 711/101; 711/102; 711/103; 711/104; 365/185.01; 365/185.2; 365/185.24; 365/185.33; 365/200

(58) Field of Classification Search .............. None
See application file for complete search history.

(56) References Cited

U.S. PATENT DOCUMENTS

| RE37,611 | E  | * | 3/2002 | Roohparvar | 365/185.22 |
|---|---|---|---|---|---|
| 6,904,400 | B1 | * | 6/2005 | Peri et al. | 703/28 |
| 7,058,755 | B2 |   | 6/2006 | Nallapa |  |
| 2004/0017718 | A1 | * | 1/2004 | Ooishi | 365/210 |
| 2005/0063228 | A1 | * | 3/2005 | Beckert et al. | 365/200 |
| 2006/0229830 | A1 |   | 10/2006 | Saether |  |
| 2007/0143528 | A1 | * | 6/2007 | Przybylek | 711/103 |
| 2007/0213946 | A1 | * | 9/2007 | Saether | 702/60 |
| 2009/0034332 | A1 | * | 2/2009 | Noichi | 365/185.09 |

* cited by examiner

*Primary Examiner* — John P Trimmings
(74) *Attorney, Agent, or Firm* — Joanna G. Chiu; James L. Clingan, Jr.

(57) ABSTRACT

Detecting brown-out in a system having a non-volatile memory (NVM) includes loading data in the NVM, wherein a next step in loading is performed on a location in the NVM that is logically sequential to an immediately preceding loading. A pair of adjacent locations include one with possible data and another that is empty. Determining which of the two, if at all, have experienced brownout includes using two different sense references. One has a higher standard for detecting a logic high and the other higher standard for detecting a logic low. Results from using the two different references are compared. If the results are the same for both references, then there is no brownout. If the results are different for either there has been a brownout. The location with the different results is set to an invalid state as the location that has experienced the brownout.

20 Claims, 5 Drawing Sheets

METHOD AND CIRCUIT FOR BROWNOUT DETECTION IN A MEMORY SYSTEM

BACKGROUND

1. Field

This disclosure relates generally to memory systems, and more specifically, to a method and circuit for brownout detection in a non-volatile memory system.

2. Related Art

Non-volatile memory systems typically require, during update cycles, a minimum supply voltage level for proper operation. During brownouts, the supply voltage of a non-volatile memory system drops below its minimum supply voltage level, which can result in data errors either at the point of recovery or later in the future, or may even result in a fatal error of the memory system. Brownouts are typically unexpected losses of power during operation. Therefore, in order to protect non-volatile memory systems and prevent errors caused by drops in the supply voltages of the memory systems during active operation, it is desirable to detect the occurrence of brownouts so that they can be safely recovered.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
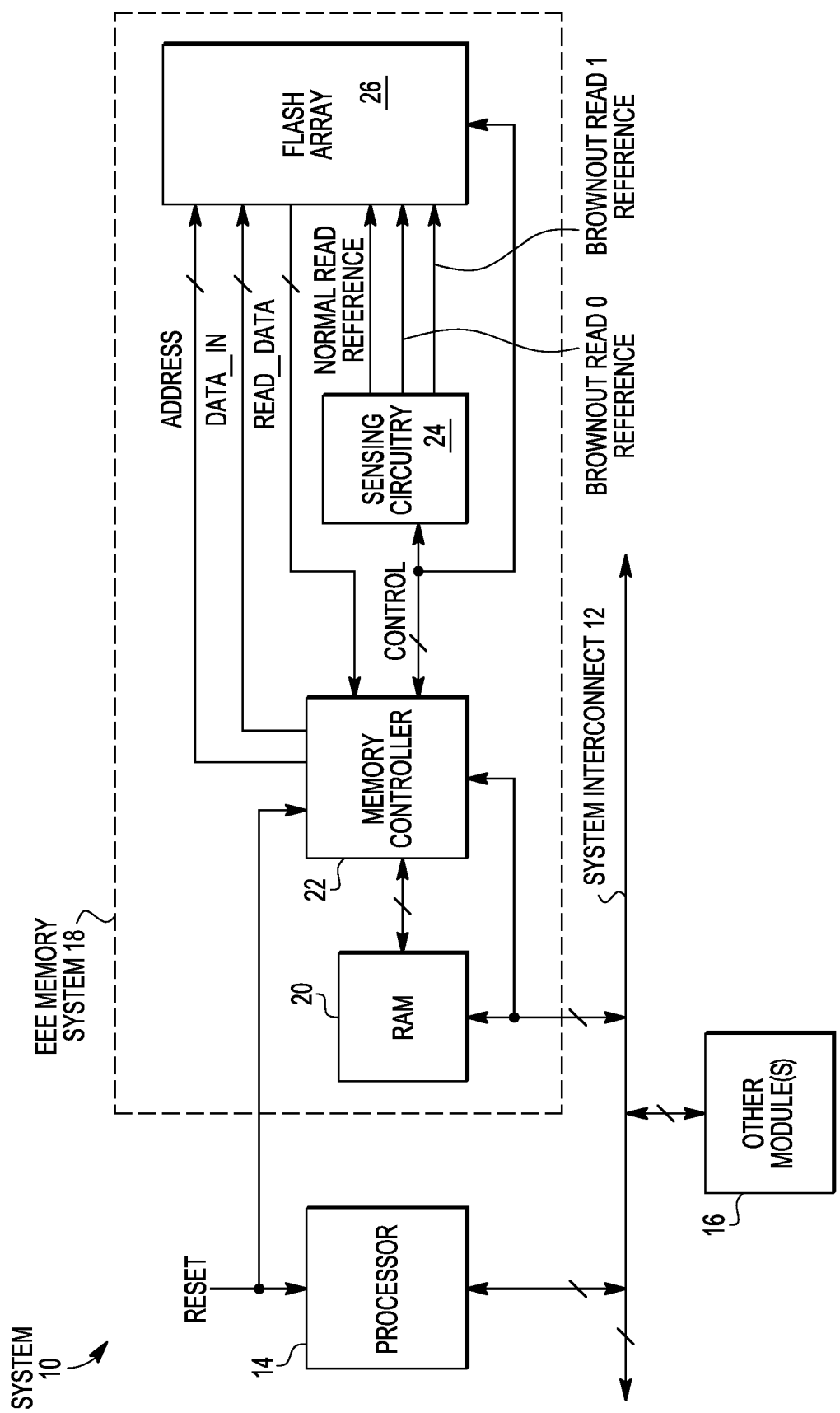
FIG. 1 illustrates in block diagram form a system, including a non-volatile memory system, in accordance with an embodiment of the present invention.

As described above, brownouts (e.g. un-expected losses of power) during operation of a non-volatile memory system can result in various types of errors. For example, one type of non-volatile memory system for which brownouts are problematic are emulated electrically erasable programmable read only memory (EEPROM) systems (EEE systems). In one example of an EEE system, a processor or other master device communicates directly to a random access memory (RAM). A memory controller of the EEE system monitors updates to the RAM and stores updated address/data pairs (corresponding to the address of the updated location in the RAM and the data corresponding to that address) in a non-volatile memory (NVM), such as, for example, a flash memory. These address/data pairs (where each pair may be referred to as a record) are sequentially stored in the order in which they are updated by the processor or master device to consecutive locations in the NVM. A brownout may occur during the storing of a new record into an NVM location, which may result in errors, either at failure time or in the future. Therefore, in one embodiment of the present invention, in response to a reset of the memory system (which may occur after a brownout), the last location in the NVM to have been apparently filled by the memory controller in response to a RAM update and/or the next location in the NVM, adjacent to the apparently filled location, that is apparently still empty are checked to determine if a brownout has occurred. In one embodiment, if a brownout is detected, the corresponding location in the NVM may be invalidated.

In one embodiment, a flash memory is used as the NVM. In one example, and as used herein, programming refers to storing a logic level zero to a bitcell and erasing refers to storing a logic level one to a bitcell. However, in alternate embodiments, programming may refer to storing a logic level one to a bitcell and erasing may refer to storing a logic level zero to a bitcell. A logic level zero may also be referred to as a logic low and a logic level one may also be referred to as a logic high. Also, the embodiments of FIGS. 1-4 herein will be described in reference to a EEE memory system; however, the discussions herein can apply to any non-volatile memory system which implements a sequential record system where it is possible to determine which locations would have been recently programmed or erased upon reset and therefore, could have been at risk of having been programmed or erased during a brownout. Also, as will be described below, the non-volatile memory system has the ability to set a variable read reference.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

The symbol "$" preceding a number indicates that the number is represented in its hexadecimal or base sixteen form. The symbol "%" preceding a number indicates that the number is represented in its binary or base two form. Note that in FIG. 2, the value of "FFFF" is in hexadecimal form and corresponds to "1111111111111111" in binary form.

FIG. 1 illustrates, in block diagram form, a system 10 which includes a processor 14, other module(s) 16 (if any), a system interconnect 12, and an EEE memory system 18 (which may also be referred to as a memory system or a non-volatile memory system). Each of processor 14, other module(s) 16, and EEE memory system 18 are bidirectionally coupled to system interconnect 12. EEE memory system 18 includes a RAM 20, a memory controller 22, sensing circuitry 24, and a flash array 26 (which may also be referred to as an NVM array, where any type of NVM may be used in place of the flash memory). RAM 20 is bidirectionally coupled to system interconnect 12 and to memory controller 22. Memory controller 22 is coupled to sensing circuitry 24 and flash array 26. Sensing circuitry 24 is coupled to flash array 26. Memory controller 22 communicates control signals with sensing circuitry 24. Memory controller communicates control signals with flash array 26, provides an address and data_in to flash array 26 and receives read_data from flash array 26. Sensing circuitry 24 is capable of providing a normal read reference, a brownout read 0 reference, and a brownout read 1 reference to flash array 26. In one embodiment, only one of these references (which may be in the form of a reference voltage and/or reference current) is provided at a time to flash array 26. A reset signal is provided to processor 14 and memory controller 22. This reset signal may be, for example, a global reset signal for system 10.

Processor 14 can be any type of processor, such as a microprocessor, digital signal processor, etc., or may be any other type of interconnect master which can access EEE memory system 18. In one form, system interconnect 12 is a system bus. Other forms of interconnect may be used including, for example, crossbars, point-to-point connections, and optical and wireless transmission techniques. Other modules 16 may include any type of module, such as, for example, another memory, another processor, another interconnect master, a peripheral, an input/output (I/O) device, etc. Alternatively, no other modules may be present in system 10.

In operation, processor 14 can send access requests (read or write access requests) to memory system 18. The access requests from processor 14, which include an access address, and, in the case of a write access, associated write data, are provided to RAM 20. In the case of a read access, RAM 20 provides processor 14 the data stored at the received access address location. In the case of a write access, RAM 20 stores the received write data at the received access address location. In the case of a write access, memory controller 22 may detect an update of RAM 20 and selectively store the received access address and associated write data to flash array 26 in a logically sequential manner. For example, in the case of an update (a write) to RAM 20, the received access address and associated write data are used to form a record that is written to flash array 26 at the next available location. This next available location is logically sequential to a location that was loaded during an immediately preceding loading of flash array 26. (Note that, referring to FIG. 1, the received access address can be provided as address to flash array 26 and the associated write data as data in to flash array 26.) In one example, the writing of the record corresponding to the RAM update is only performed if the value that is currently stored at the RAM location is different from the new write value associated with the write access request for that RAM location. In this manner, flash array 26 can store the values of RAM 20 which have been updated in a more permanent manner. That is, when RAM 20 loses power, its data is lost. Upon restoring power, the values of the RAM may be restored from flash array 26, which does not lose its data upon losing power. In one embodiment, flash array 26 has a greater storage capacity than RAM 20. For example, flash array 26 may have a capacity of at least four times greater than RAM 20.

Figure 2:
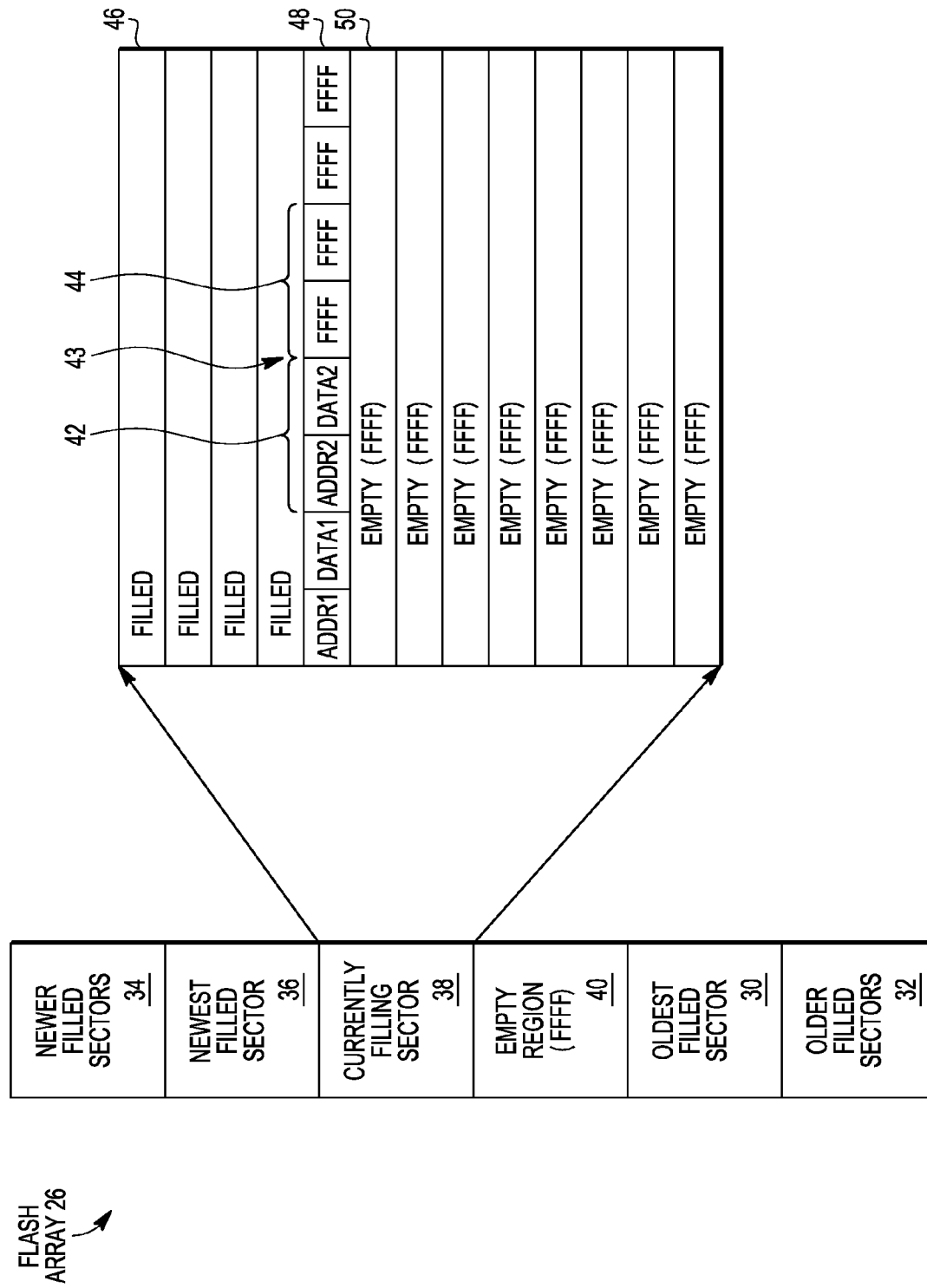
FIG. 2 illustrates, in block diagram form, a flash array of FIG. 1 in accordance with an embodiment of the present invention.

Operation of EEE memory system 18 will be described in further detail with respect to FIG. 2. FIG. 2 illustrates, in block diagram form, an embodiment of flash array 26 during operation of EEE memory system 18. Initially, all of flash array 26 is empty. In one embodiment, when a location of flash array 26 is empty, it has not yet been written with any value thus is in its erased state. In the embodiments described herein, the erased state corresponds to a logic level one; therefore, each empty or erased location of flash array 26 stores a logic level one. Flash array 26 includes N sectors. In one embodiment, data may be written to any location within these sectors; however, when an erase is desired, each sector can only be erased as a block (on a sector by sector basis, where an erase of a sector may simultaneously erase all the contents of that sector). Note that when, in FIG. 2, a particular sector, region, or line is referred to as empty, "FFFF" is provided in parenthesis which represents that the bits in that empty sector, region, or line are logic level ones.

As described above, each location of flash array 26 is updated in a sequential order, starting with a first location. Upon a next, immediately subsequent, update of RAM 20 (where the new write value is different from the value currently stored at the RAM location to be updated), a next location, adjacent and logically sequential to the first location, is written with a new record (and thus becomes the previous location for an immediately subsequent update). Therefore, upon an immediately subsequent update of RAM 20 (where the new write value is different from the value currently stored at the RAM location to be updated), a next location, adjacent and logically sequential to the previous location, is written with a new record. Thus, with each update of RAM 20 that is to be reflected in flash array 26, flash array 26 is loaded with a new record in a sequential manner. In the illustrated embodiment, flash array 26 includes an empty region 40 (which may include one or more empty sectors), an oldest filled sector 30, older filled sectors 32, newer filled sectors 34, a newest filled sector 36, and a currently filling sector 38. In the illustrated embodiment, the first location to have been written upon an update of RAM 20 is the first location within oldest filled sector 30. That is, filled sector 30 is filled with records (address/data pairs corresponding to data stored in RAM 20) and was the sector that was first filled. In one embodiment, a filled sector, such as filled sectors 30, 32, 34, and 36, includes no empty locations. The next sectors, in time, to have been filled after oldest filled sector 30 are older filled sectors 32. Each sector in older filled sectors 32 was filled in sequentially, where each location in each sector of older filled sectors 32 was filled in sequentially. The next sectors, in time, to have been filled after older filled sectors 32 are newer filled sectors 34. Again, each sector in newer filled sectors 34 was filled in sequentially, where each location in each sector of newer filled sectors 34 was filled in sequentially. Also, note that after the last filled sector of older filled sectors 32, the sequential filling wrapped around to the top of flash array 26 to the first sector of newer filled sectors 34. Therefore, note that two record locations in flash array 26 (i.e. a pair of NVM locations) may be considered adjacent (i.e. logically adjacent or logically sequential), even if the second of the two locations requires a wrap around either to the next line, next sector, or even the top of flash array 26. The next sector, in time, to have been filled after newer filled sectors 34 is newest filled sector 36. Again, each location in newest filled sector 36 was filled in sequentially. Therefore, newest filled sector 36 stores more recent data from RAM 20 than newer filled sectors 34 which store more recent data from RAM 20 than older filled sectors 32 which store more recent data from RAM 20 than oldest filled sector 30.

Still referring to FIG. 2, the next sector, in time, to be filled after newest filled sector 36 is currently filling sector 38. Therefore, FIG. 2 represents flash array 26 at a particular point in time during operation of memory system 18 during which sector 38 is currently being filled. FIG. 2 illustrates a blown up version of this sector to better understand how flash array 26 gets sequentially filled (i.e. written to or loaded). Note that currently filling sector 38 began filling at its first location after the last location of newest filled sector 36 was filled. Currently filling sector 38 is illustrated as having a plurality of lines, where each of the first four lines represents a filled line 46 (in which all locations within the line are filled and thus no locations within that line are empty). Each of the last 8 lines of currently filling sector 38 represents an empty line 50 (in which all locations within the line are empty, being logic level ones, and thus no locations within the line are filled). Currently filling sector 38 is currently being filled at line 48, which includes both filled locations and empty locations, separated by a boundary 43. Note that location 42 represents the location storing the most recently written record where ADDR2 represents the address location in RAM 20 that was most recently updated with a new value and DATA2 represents the updated value written to that address location in RAM 20. Location 44, which is adjacent location 42, represents the next available, sequentially addressable, location where the next update to RAM 20 would be recorded. Note that the location sequentially preceding location 42 stores ADDR1 which represents the next most recently updated address location in RAM 20, updated prior to ADDR2, and DATA1 represents the updated value that was written to ADDR1 in RAM 20. Note that, in one embodiment, since updates of ADDR1 and ADDR2 were stored in flash array 26, it is assumed that DATA1 and DATA2 were different values from those stored at ADDR1 and ADDR2, respectively, prior to the updates. Also, note that each sector of flash array 26 can have any number of lines, and the illustration of currently filling sector 38 simply provides one example of the sectors each including 13 lines. Therefore, it can be understood how the loading of flash array 26 is performed sequentially according to sequential addresses. Furthermore, during operation of EEE memory system 18, flash array 26 may include a pair of locations that includes a last filled location (e.g. location 42) and an empty location sequential to the last filled location (e.g. location 44).

Brownouts may occur during the writing of new values to flash array 26, which may result in erroneous data. The location most likely affected by a brownout is the location that was most recently written to within flash array 26. Due to the sequential nature of how flash array 26 is filled, it is known which location was most likely affected, if at all, by a brownout. For example, in one embodiment, a brownout may have occurred during the writing of location 42 in currently filling sector 38 where either the address or data portion (ADDR2 or DATA2) of location 42 actually stores an incorrect value (and thus the data stored in location 42 may be referred to as "possible data"). In another example, a brownout may have occurred during the writing of location 44. However, it may be that location 44 was not yet sufficiently programmed to its desired values, thus still being read as "FFFF" (i.e. as empty) even though it was already "touched", i.e. attempted to be written to, when the brownout occurred. Therefore, location 44 may be seemingly empty rather than truly empty. In this case, one or more bits of location 44 may have been left in a marginally erased state which may cause future problems. For example, bits left in a marginally erased state may not maintain their desired states for a sufficient amount of time. These marginal bits will be described in more detail below in reference to FIG. 3.

Figure 3:
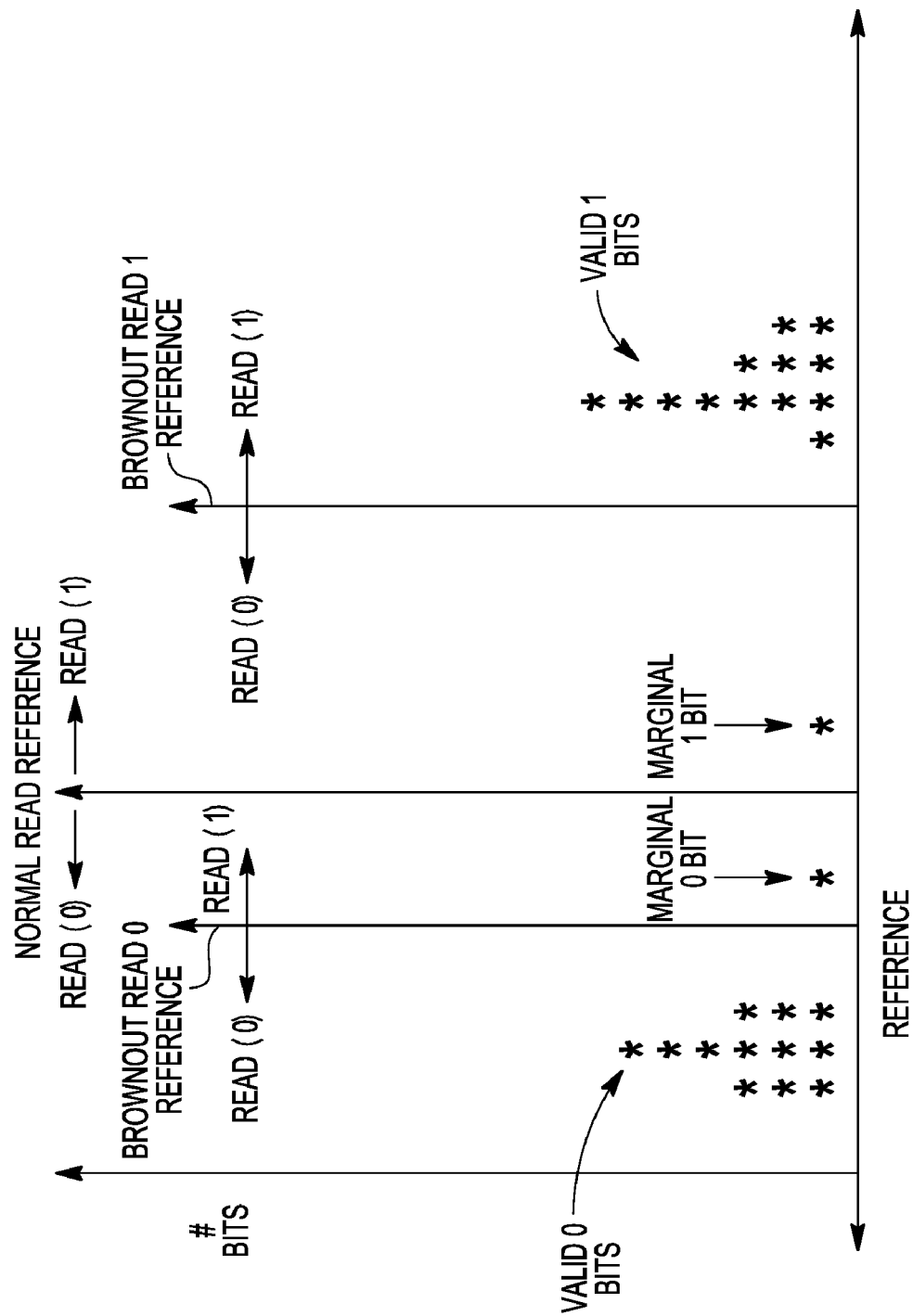
FIG. 3 illustrates a histogram of bits in accordance with an embodiment of the present invention.

FIG. 3 illustrates a histogram representative of bits within a record of flash array 26. Note that, after being written, a number of bits may represent valid 0 bits and a number of bits may represent valid 1 bits. The valid 0 bits are those bits which are considered programmed strongly enough with respect to the normal read reference as according to a specification of flash array 26. When strongly programmed, a programmed bit should hold its programmed state for at least a predetermined time as according to the specification of flash array 26. The valid 1 bits are those bits which are considered erased strongly enough with respect to the normal read reference as according to the specification of flash array 26. When strongly erased, an erased bit should hold its erased state for at least a predetermined time as according to the specification of flash array 26. Note that the specification of flash array 26 may also contain additional requirements, as known in the art, to define what constitutes sufficiently programmed or sufficient erased for a bit. However, note that when a bit is not programmed or erased well enough, marginal bits may result.

For example, FIG. 3 illustrates a marginal 0 bit which has not been sufficiently programmed to a logic level 0. If this marginal 0 bit is read using the normal read reference, it will be correctly read as a logic level 0 (as a programmed bit). However, over time or over extreme operating conditions, the value of this marginal 0 bit may drift to the point it goes to the right of the normal read reference and thus may, in the future, actually be read as a logic level 1 (an erased bit). Since this marginal 0 bit is located closer to the normal read reference as compared to the valid 0 bits, the amount of time it will hold its programmed state is less as compared to the valid 0 bits, thus possibly causing premature failure. FIG. 3 also illustrates a marginal 1 bit which has not been sufficiently erased to a logic level 1. If this marginal 1 bit is read using the normal read reference, it will be correctly read as a logic level 1 (as an erased bit). However, over time or over extreme operating conditions, the value of this marginal 1 bit may drift to the point it goes to the left of the normal read reference and thus may, in the future, actually be read as a logic level 0 (a programmed bit). Since this marginal 1 bit is located closer to the normal read reference as compared to the valid 1 bits, the amount of time it will hold its erased state is less as compared to the valid 1 bits, thus possibly causing premature failure.

Therefore, the presence of these marginal 0 and 1 bits can result in premature failure. In one embodiment, as will be described in more detail in reference to FIGS. 4 and 5 below, these marginal bits can be detected using a variable read reference. For example, in one embodiment, two additional read references may be used: a brownout read 0 reference and a brownout read 1 reference. As can be seen in FIG. 3, the brownout read 0 reference is located further towards the valid 0 bits as compared to the normal read reference and thus sets a higher, more stringent, standard than the normal read reference for detecting a logic level 0 by sensing circuitry 24. Note that, if the brownout read 0 reference is used to sense the values of the bits of the record, the valid 0 bits will still be read correctly as a logic level 0 (as programmed bits) since they are located to the left of the brownout read 0 reference. However, the marginal 0 bit will now be read as a logic level 1 (an erased bit) since it is located to the right of the brownout read 0 reference. The brownout read 1 reference is located further towards the valid 1 bits as compared to the normal read reference and thus sets a higher, more stringent, standard than the normal read reference for detecting a logic level 1 by sensing circuitry 24. Note that, if the brownout read 1 reference is used to sense the values of the bits of the record, the valid 1 bits will still be read correctly as a logic level 1 (as erased bits) since they are located to the right of the brownout read 1 reference. However, the marginal 1 bit will now be read as a logic level 0 (a programmed bit) since it is located to the left of the brownout read 1 reference. Therefore, valid 0 bits and valid 1 bits should be sensed as the same value, regardless of which read reference is being provided by sensing circuitry 24 (brownout read 0 reference or brownout read 1 reference). Therefore, if the value of a record sensed using the different references (brownout read 0 reference or brownout read 1 reference) differs, then the record is likely to include a marginal bit, which may indicate that a brownout (or some other problem) occurred to the program or erase of that record. This comparison may be used to determine if a brownout occurred.

Figure 4:
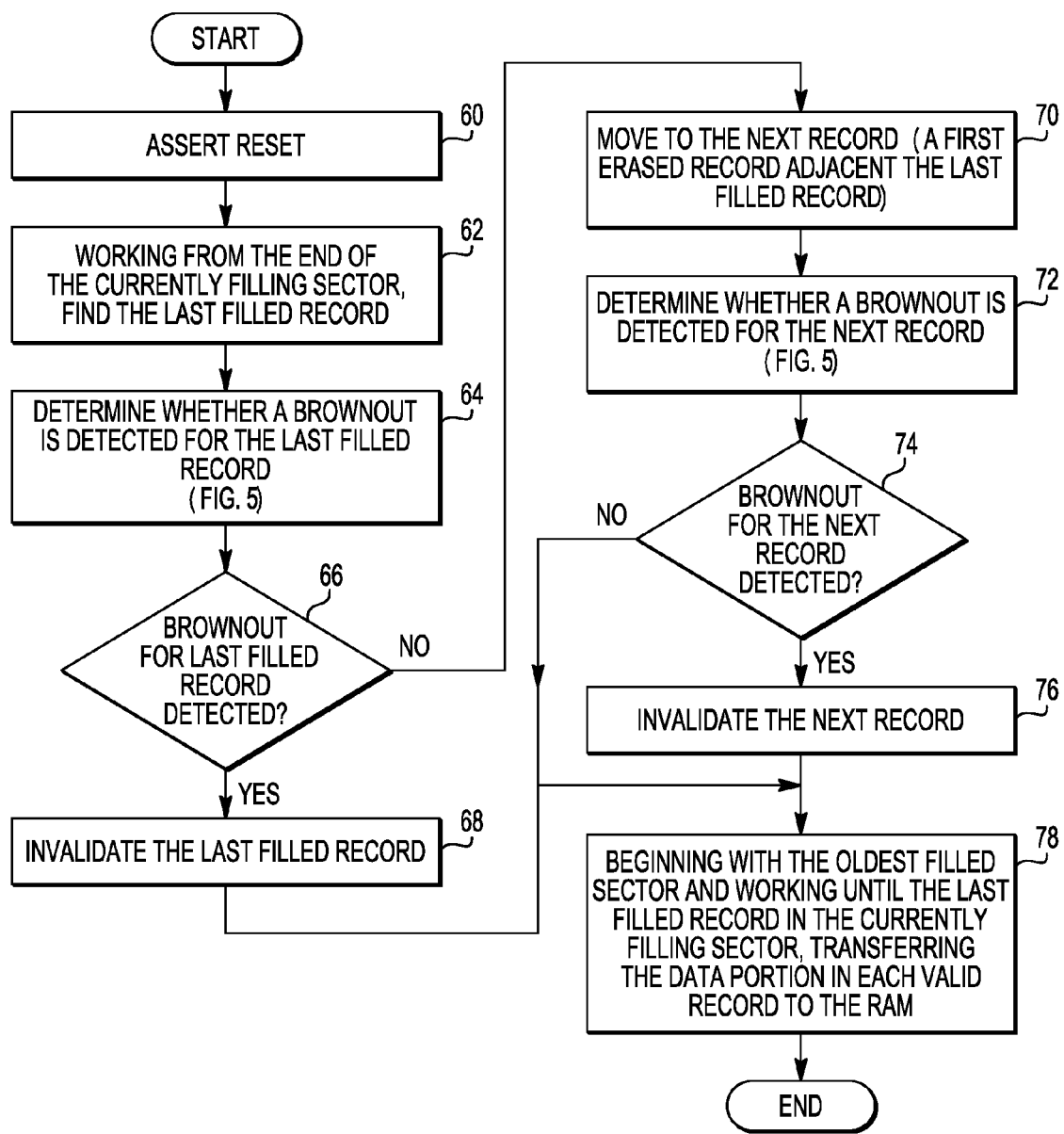
FIGS. 4 and 5 illustrate, in flow diagram form, a method of detecting brownouts in the memory system of FIG. 1, in accordance with an embodiment of the present invention.
Figure 5:
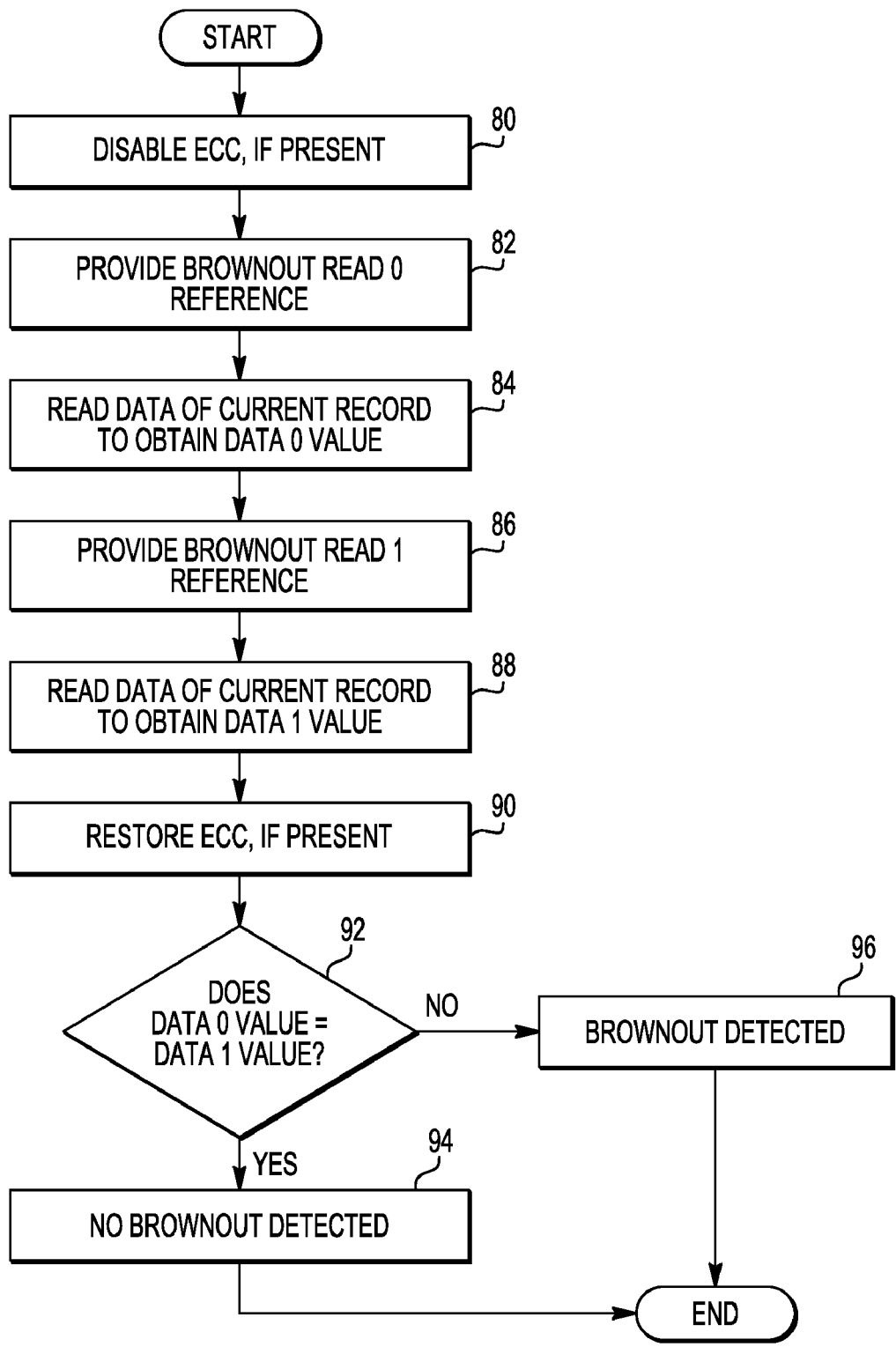

FIGS. 4 and 5 illustrate, in flow diagram form, a method for detecting a brownout in accordance with one embodiment of the present invention. FIG. 4 begins with block 60 in which a reset occurs, i.e. in which the reset signal is asserted. Flow then proceeds to block 62 in which, working from the end of the currently filling sector, the last filled record is found. For example, referring to the example of FIG. 2, by working from the end of currently filling sector 38, the first record that is not all logic level ones (i.e. filled rather than empty) is found as the last filled record. In the example of FIG. 2, this last filled record corresponds to the record stored in location 42. Flow then proceeds to block 64 in which it is determined whether or not a brownout is detected for the last filled record. For example, it may seem that the last filled record, because it is not empty, was sufficiently filled. However, if a brownout occurred during the writing of this last filled record, it may not have been accurately or sufficiently filled. The flow for this brownout determination will be described below with respect to FIG. 5. Flow then proceeds to decision diamond 66 where it is determined whether a brownout for the last filled record is detected. If so, flow proceeds to block 68 where the last filled record is invalidated. In one embodiment, a record of flash array 26 is invalidated by memory controller 22 writing all logic level zeros to the address portion of the record. In other embodiments, other invalidating methods may be used to invalidate a record. If, at decision diamond 66, a brownout for the last filled record was not detected, flow proceeds to block 70 where the next record is identified. The next record corresponds to a first erased record adjacent the last filled record. For example, referring to the example of FIG. 2, the next record (the first erased record adjacent the last filled record) is stored in location 44 in currently filling sector 38, which is adjacent to location 42. Flow then proceeds to block 72 in which it is determined whether or not a brownout is detected for this next record which supposed is empty. For example, it may seem that this next record is the first erased record because it is still read as storing all logic levels one (when using the normal read reference). However, if a brownout occurred during an attempt to write, i.e. fill, this first empty record, it may not actually be empty as it appears. The flow for this brownout determination will also be described below with respect to FIG. 5. Flow then proceeds to decision diamond 74 where it is determined whether a brownout for the next record is detected. If so, flow proceeds to block 76 where the next record (i.e. the first seemingly erased record) is invalidated (where any method of invalidating this record may be used).

After block 76 or block 68, or if, at decision diamond 74, a brownout for the next record was not detected, flow proceeds to block 78 where RAM 20 is updated using the values stored in flash array 26. That is, upon a reset, the values of RAM 20 need to be restored. In one embodiment, RAM 20 is first written to logic level ones prior to performing the operation of block 78. In block 78, beginning with the oldest filled sector and working until the last filled record in the currently filling sector, the data portion of each valid record in flash array 26 is transferred to RAM 20. For example, referring to FIG. 2, starting with the first location of oldest filled sector 30 and continuing through to location 42, each of the valid records are transferred by memory controller 22 to RAM 20. For example, flash array 26 can provide the data for each valid record to memory controller 22 as read_data using the normal read reference. Memory controller 22 can then store the data portion of the received record to the appropriate location of RAM 20 (as provided by the address portion of the received record). The flow of FIG. 4 then ends, and can be repeated each time reset is asserted.

FIG. 5 illustrates, in flow diagram form, a method for determine whether or not a brownout occurred during writing of a particular record. Therefore, in the flow of FIG. 5, the current record can refer to either the last filled record, such as in block 64 of FIG. 4, or the next record, such as in block 72 of FIG. 4. The flow of FIG. 5 begins with block 80 in which error correction code (ECC), if present and used within memory system 18, is disabled. Flow then proceeds to block 82 in which brownout read 0 reference is provided (such as during a first test read mode) by sensing circuitry 24 to flash array 26. In one embodiment, the reference voltage in flash array 26 is switched from the value of the normal read reference to the value of brownout read 0 reference. Flow then proceeds to block 84 in which the data of the current record is read (e.g. sensed by sensing circuitry 24), using the brownout read 1 reference, to obtain a data 0 value (e.g. a first test value). Note that the data 0 value includes both the address and data portions of the current record being read. Flow then proceeds to block 86, in which brownout read 1 reference is provided (such as during a second test read mode) by sensing circuitry 24 to flash array 26. In one embodiment, the reference voltage in flash array 26 is switched from the value of the brownout read 0 reference to the value of brownout read 1 reference. Flow then proceeds to block 88 in which the data of the current record is read (e.g. sensed by sensing circuitry 24), using the brownout read 1 reference, to obtain a data 1 value (e.g. a second test value). Note that the data 1 value includes both the address and data portions of the current record being read. Flow then proceeds to block 90 in which ECC, if present and used within memory system 18, is restored.

Flow then proceeds to decision diamond 92, in which it is determined whether the data 0 value equals the data 1 value. If so, then flow proceeds to block 94 in which no brownout is detected for the current record and if not, flow proceeds to block 96 in which a brownout is detected for the current record. That is, as explained in reference to FIG. 3, if the bits of a record are either strongly programmed or erased, then regardless of which reference (brownout read 0 reference or brownout read 1 voltage) is used, the read value should be the same. However, if any bits of the record are marginally erased or programmed, then the data value read when using brownout read 1 reference versus brownout read 0 reference differs for these bits. Therefore, since the different data values indicate the existence of a marginal bit, it is assumed that a brownout occurred during the writing of the current record, and is thus handled by being invalidated.

Note that, referring to the flow of FIG. 4, first the last filled record is checked to determine if a brownout occurred, and only if one was not detected for that last filled record was the next record (i.e. the first erased record adjacent the last filled record) checked for occurrence of a brownout. In an alternate embodiment, the next record may be checked first, prior to the last filled record, and only if no brownout is detected in the next record is the last filled record then checked. Note that, in one embodiment, a brownout will only affect one record, meaning that if a brownout is detected in the first record checked, the other record need not be checked. However, in an alternate embodiment, both the last filled record and the next record, in any order, can be checked for brownouts, even if a brownout is detected in the first one checked.

In an alternate embodiment, note that RAM 20 may not be present. In this embodiment, memory controller 22 may directly write any updates from processor 14 (which would update RAM 20 if present) directly to flash array 26. In this embodiment, in response to a read request from processor 14, memory controller 22 may search through each filled entry of flash array 26 to find the most recent entry corresponding to the requested access location to provide the read data back to processor 14. In yet another embodiment, RAM 20 may not be present, but an intermediate tag array may be used to indicate where in flash array 26 updated values are stored in order to more rapidly find the most recent updated value for a particular address location.

In one embodiment, a minimum size for empty region 40 in flash array 26 is maintained. Therefore, in one embodiment, at some point prior to filling a new sector (such as the next sector to be filled after newest filled sector 36, which could be within empty region 40), the valid records from another sector, such as the oldest filled sector 30, may be copied to the currently filling sector before the other sector is erased to become a part of empty region 40 in order to maintain a minimum size for empty region 40. This operation maybe repeated as required until the minimum size for empty region 40 is achieved. During this operation a record is considered valid if there are no newer records elsewhere in flash array 26 that refer to the same RAM address.

By now it should be appreciated that there has been provided a method and circuit for accurately detecting brownouts by using the knowledge of the last location within an NVM array that was updated prior to reset and by using varying read references to detect possible marginal bits. Also, although the above descriptions of FIGS. 1-4 were provided with respect to a flash memory (e.g. flash array 26), any type of NVM array may be used.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of system 10 are circuitry located on a single integrated circuit or within a same device. Alternatively, system 10 may include any number of separate integrated circuits or separate devices interconnected with each other. For example, memory system 18 may be located on a same integrated circuit as processor 14 or on a separate integrated circuit. Memory system 18 may be an embedded memory system or a stand alone memory system. Other module(s) 16 may also be located on separate integrated circuits or devices.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, any memory system which uses sequential loading may be used rather than a EEE memory system, and any type of NVM may be used rather than a flash memory. Also, RAM 20 may or may not be present as part of memory system 18. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a method of detecting brownout in a system (for example, 10) having a non-volatile memory (NVM) (for example, 26), including loading data in the NVM, wherein a next step in loading is performed on a location (for example, 42) in the NVM that is logically sequential to an immediately preceding loading; identifying a pair of adjacent locations in the NVM in which one location (for example, 42) of the pair of adjacent locations is filled with possible data and another location (for example, 44) of the pair of adjacent locations is empty using a first reference (for example, normal read reference) for determining contents of the pair; determining the contents of a first location of the pair using a second reference (for example, brownout read 1 reference) to obtain a first test value for the first location, wherein the second reference sets a higher standard for identifying a logic high; determining the contents of the first location using a third reference (for example, brownout read 0 reference) to obtain a second test value for the first location, wherein the third reference sets a higher standard for identifying a logic low; and determining if the first test value is the same as the second test value. If the first test value is the same as the second test value, the method of item 1 further includes determining the contents of a second location of the pair using the second reference to obtain a third test value for the second location; determining the contents of the second location using the third reference to obtain a fourth test value for the second location; and determining if the third test value is the same as the fourth test value. A brownout is detected if a determination including one of a group consisting of the first test value is different than the second test value and third test value is different than the fourth test value occurs. Item 2 includes the method of item 1, or any other appropriate item herein, wherein the first location includes the one location of the pair of adjacent locations that is filled with possible data. Item 3 includes the method of item 1, or any other appropriate item herein, wherein the second location includes the one location of the pair of adjacent locations that is filled with possible data. Item 4 includes the method of item 1, or any other appropriate item herein, and further includes if the first test value is different than the second test value, determining the contents of the second location of the pair using the second reference to obtain the third test value for the second location; determining the contents of the second location using the third reference to obtain the fourth test value for the second location; and determining if the third test value is the same as the fourth test value. Item 5 includes the method of item 1, or any other appropriate item herein, wherein the steps of determining the contents of the second location of the pair, determining the contents of the second location using the third reference, and determining if the third test value is the same as the fourth test value are performed only if the first test value is the same as the second test value. Item 6 includes the method of item 1, or any other appropriate item herein, wherein a brownout is determined to have not occurred if the first test value is the same as the second test value and third test value is the same as the fourth test value. Item 7 includes the method of item 1, or any other appropriate item herein, and further includes loading valid data in a random access memory (RAM) (for example, 20), wherein the step of loading data in the RAM is further characterized as loading data that corresponds to the valid data. Item 8 includes the method of item 7, or any other appropriate item herein, wherein the NVM has a capacity of at least four times greater than the RAM. Item 9 includes the method of item 8, or any other appropriate item herein, wherein the NVM has plurality of sectors and the method further includes writing contents of a first sector (for example, 32) into a second sector (for example, 40); and erasing the first sector after the step of writing the contents. Item 10 includes the method of item 9, or any other appropriate item herein, wherein the NVM is a flash memory and the step of erasing is further characterized as performing an erase step on all the contents of the first sector simultaneously. Item 11 includes the method of item 1, or any other appropriate item herein, and further includes invalidating the contents of the first location if the step of determining if the first test value is the same as the second test value does not determine that the first test value is the same as the second test value.

Item 12 includes a system (for example, 10) including a non-volatile memory (NVM) (for example, 26) having contents that are sequentially addressable; sensing circuitry (for example, 24) able to sense data in the NVM using a first reference (for example, normal read reference) for a normal read mode, a second reference (for example, brownout read 1 reference) for a first test read mode in which detecting a logic high is at higher standard than the normal read mode, and a third reference (for example, brownout read 0 reference) for a second test read mode in which detecting a logic low is at higher standard than the normal read mode; and a memory controller (for example, 22) for loading the contents of the NVM by sequential addressing; identifying a pair of adjacent locations (for example, 42, 44) in the NVM in which one location of the pair of adjacent locations is filled with possible data and another location of the pair of adjacent locations is empty using the sensing circuitry in the normal read mode; determining the contents of a first location of the pair using the sensing circuitry in the first test read mode to obtain a first test value; determining the contents of the first location of the pair using the sensing circuitry in the second test read mode to obtain a second test value; determining if the first test value is the same as the second test value; and if the first test value is the same as the second test value, for: determining the contents of a second location of the pair using the sensing circuit in the first test read mode to obtain a third test value; determining the contents of the second location using the sensing circuit in the second test read mode to obtain a fourth test value; determining if the third test value is the same as the fourth test value; and identifying that a brownout has occurred if a determination comprising one of a group consisting of the first test value is different than the second test value and third test value is different than the fourth test value is made. Item 13 includes the system of item 12, or any other appropriate item herein, wherein the first location comprises the one location of the pair of adjacent locations that is filled with possible data. Item 14 includes the system of item 12, or any other appropriate item herein, wherein the first location comprises a first address portion (for example, ADDR2) and a first data portion (for example, DATA2) and the second location comprises a second address portion and a second data portion. Item 15 includes the system of item 12, or any other appropriate item herein, wherein, if the first test value is different than the second test value, the memory controller is further characterized as being for: determining the contents of the second location of the pair using the sensing circuit in the first test read mode to obtain the third test value; determining the contents of the second location using the sensing circuit in the second test read mode to obtain the fourth test value; and determining if the third test value is the same as the fourth test value. Item 16 includes the system of item 12, or any other appropriate item herein, wherein the memory controller is further characterized by being for invalidating the contents of the first location if the first test value is not the same as the second test value or invalidating the contents of the second location if the third test value is not the same as the fourth test value. Item 17 includes the system of item 12, or any other appropriate item herein, wherein the memory controller is further characterized as determining a brownout has not occurred if the first test value is the same as the second test value and third test value is the same as the fourth test value. Item 18 includes the system of item 12, or any other appropriate item herein, wherein the contents loaded into the NVM by sequential addressing are from the random access memory.

Item 19 includes a method including providing a random access memory (RAM); providing non-volatile memory (NVM); loading the RAM with valid data; loading the NVM with data corresponding to the valid data, wherein the manner of loading the NVM is sequential according to sequential addresses of the NVM so that there is a pair of locations comprising a last filled location and an empty location sequential to the last filled location; determining the pair of locations using a first reference for sensing contents of the pair of locations; determining if a first location of the pair of locations has experienced a brownout, including determining the contents of the first location as a first value using a second reference for sensing, wherein the second reference sets a higher standard for determining a logic high than the first reference; determining the contents of the first location as a second value using a third reference for sensing, wherein the third reference sets a higher standard for determining a logic low than the first reference; comparing the first value to the second value; if the first value is different from the second value, identifying that a brownout has occurred; and if the first value is the same as the second value, perform further steps including determining the contents of the second location as a third value using the second reference for sensing; determining the contents of the second location as a fourth value using the third reference for sensing; comparing the third value to the fourth value; if the third value is different from the fourth value, identifying that a brownout has occurred; and if the third value is the same as the fourth value, identifying that a brownout has not occurred. Item 20 includes the method of item 19, or any other appropriate item herein, and further includes invalidating the first location if the first value is different than the second value.

What is claimed is:

1. A method of detecting brownout in a system having a non-volatile memory (NVM), comprising:
    loading data in the NVM, wherein a next step in loading is performed on a location in the NVM that is logically sequential to an immediately preceding loading;
    identifying a pair of adjacent locations in the NVM in which one location of the pair of adjacent locations is filled with possible data and another location of the pair of adjacent locations is empty using a first reference for determining contents of the pair;
    determining the contents of a first location of the pair using a second reference to obtain a first test value for the first location, wherein the second reference sets a higher standard for identifying a logic high;
    determining the contents of the first location using a third reference to obtain a second test value for the first location, wherein the third reference sets a higher standard for identifying a logic low;
    determining if the first test value is the same as the second test value; and
    if the first test value is the same as the second test value, the method further comprises:
        determining the contents of a second location of the pair using the second reference to obtain a third test value for the second location;
        determining the contents of the second location using the third reference to obtain a fourth test value for the second location; and
        determining if the third test value is the same as the fourth test value,
    wherein a brownout is detected if a determination comprising one of a group consisting of the first test value is different than the second test value and the third test value is different than the fourth test value occurs.

2. The method of claim 1, wherein the first location comprises the one location of the pair of adjacent locations that is filled with possible data.

3. The method of claim 1, wherein the second location comprises the one location of the pair of adjacent locations that is filled with possible data.

4. The method of claim 1, further comprising;
    if the first test value is different than the second test value, invalidating the first location.

5. The method of claim 1, wherein the steps of determining the contents of the second location of the pair, determining the contents of the second location using the third reference, and determining if the third test value is the same as the fourth test value are performed only if the first test value is the same as the second test value.

6. The method of claim 1, wherein a brownout is determined to have not occurred if the first test value is the same as the second test value and third test value is the same as the fourth test value.

7. The method of claim 1, further comprising:
    loading valid data in a random access memory (RAM),
    wherein the step of loading the valid data in the RAM is further characterized as loading data that corresponds to the valid data.

8. The method of claim 7, wherein the NVM has a capacity of at least four times greater than the RAM.

9. The method of claim 8, wherein the NVM has plurality of sectors.

10. The method of claim 9, wherein the NVM is a flash memory and an erase step is performed on all contents of a sector simultaneously.

11. The method of claim 1, further comprising invalidating the contents of the first location if the step of determining if the first test value is the same as the second test value does not determine that the first test value is the same as the second test value.

12. A system, comprising:
    a non-volatile memory (NVM) having contents that are sequentially addressable;
    sensing circuitry able to sense data in the NVM using a first reference for a normal read mode, a second reference for a first test read mode in which detecting a logic high is at a higher standard than the normal read mode, and a third reference for a second test read mode in which detecting a logic low is at a higher standard than the normal read mode; and
    a memory controller for:
        loading the contents of the NVM by sequential addressing;
        identifying a pair of adjacent locations in the NVM in which one location of the pair of adjacent locations is filled with possible data and another location of the pair of adjacent locations is empty using the sensing circuitry in the normal read mode;
        determining the contents of a first location of the pair using the sensing circuitry in the first test read mode to obtain a first test value;

determining the contents of the first location of the pair using the sensing circuitry in the second test read mode to obtain a second test value;

determining if the first test value is the same as the second test value; and if the first test value is the same as the second test value, for:

determining the contents of a second location of the pair using the sensing circuit in the first test read mode to obtain a third test value;

determining the contents of the second location using the sensing circuit in the second test read mode to obtain a fourth test value;

determining if the third test value is the same as the fourth test value, and identifying that a brownout has occurred if a determination comprising one of a group consisting of the first test value is different than the second test value and the third test value is different than the fourth test value is made.

13. The system of claim 12, wherein the first location comprises the one location of the pair of adjacent locations that is filled with possible data.

14. The system of claim 12, wherein the first location comprises a first address portion and a first data portion.

15. The system of claim 12, wherein, if the first test value is different than the second test value, the memory controller is further characterized as being for invalidating the first location.

16. The system of claim 12, wherein the memory controller is further characterized by being for invalidating the contents of the first location if the first test value is not the same as the second test value or invalidating the contents of the second location if the third test value is not the same as the fourth test value.

17. The system of claim 12, wherein the memory controller is further characterized as determining a brownout has not occurred if the first test value is the same as the second test value and third test value is the same as the fourth test value.

18. The system of claim 12, further comprising a random access memory, wherein the contents loaded into the NVM by sequential addressing are from the random access memory.

19. A method, comprising:

providing a random access memory (RAM);

providing non-volatile memory (NVM);

loading the RAM with valid data;

loading the NVM with data corresponding to the valid data, wherein the manner of loading the NVM is sequential according to sequential addresses of the NVM so that there is a pair of locations comprising a last filled location and an empty location sequential to the last filled location;

determining the pair of locations using a first reference for sensing contents of the pair of locations;

determining if a first location of the pair of locations has experienced a brownout, comprising:

determining the contents of the first location as a first value using a second reference for sensing, wherein the second reference sets a higher standard for determining a logic high than the first reference;

determining the contents of the first location as a second value using a third reference for sensing, wherein the third reference sets a higher standard for determining a logic low than the first reference;

comparing the first value to the second value;

if the first value is different from the second value, identifying that a brownout has occurred;

if the first value is the same as the second value, perform further steps, comprising:

determining the contents of the second location as a third value using the second reference for sensing;

determining the contents of the second location as a fourth value using the third reference for sensing;

comparing the third value to the fourth value;

if the third value is different from the fourth value, identifying that a brownout has occurred; and if the third value is the same as the fourth value, identifying that a brownout has not occurred.

20. The method of claim 19 further comprising invalidating the first location if the first value is different than the second value.

* * * * *